(12) United States Patent
Batzer et al.

(10) Patent No.: US 12,116,669 B2
(45) Date of Patent: Oct. 15, 2024

(54) INTEGRATED SHOWERHEAD WITH IMPROVED HOLE PATTERN FOR DELIVERING RADICAL AND PRECURSOR GAS TO A DOWNSTREAM CHAMBER TO ENABLE REMOTE PLASMA FILM DEPOSITION

(71) Applicant: Lam Research Corporation, Fremont, CA (US)

(72) Inventors: Rachel Batzer, Tualatin, OR (US); Zhe Gui, Tigard, OR (US); Galbokka Hewage Layan Savithra, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/322,324

(22) Filed: May 17, 2021

(65) Prior Publication Data

US 2021/0269918 A1  Sep. 2, 2021

Related U.S. Application Data

(63) Continuation of application No. 16/213,386, filed on Dec. 7, 2018, now Pat. No. 11,015,247.
(Continued)

(51) Int. Cl.
*C23C 16/40* (2006.01)
*C23C 16/455* (2006.01)
*H01J 37/32* (2006.01)

(52) U.S. Cl.
CPC .. *C23C 16/45565* (2013.01); *H01J 37/32743* (2013.01); *H01J 2237/332* (2013.01); *H01J 2237/334* (2013.01)

(58) Field of Classification Search
CPC . C23C 16/45565; C23C 16/505; C23C 16/52; C23C 16/46; C23C 16/45536;
(Continued)

(56) References Cited

U.S. PATENT DOCUMENTS

| 5,597,439 A | 1/1997 | Salzman |
| 5,614,026 A | 3/1997 | Williams |

(Continued)

FOREIGN PATENT DOCUMENTS

| CN | 1574229 A | 2/2005 |
| CN | 101003895 A | 7/2007 |

(Continued)

OTHER PUBLICATIONS

International Search Report and Written Opinion dated Mar. 2, 2023 in PCT Application No. PCT/US2022/078786.
(Continued)

*Primary Examiner* — Rudy Zervigon
(74) *Attorney, Agent, or Firm* — Weaver Austin Villeneuve & Sampson LLP

(57) ABSTRACT

A showerhead for a substrate processing system includes a lower surface, a plasma-facing upper surface, a gas plenum defined between the lower surface and the upper surface, and a plurality of injectors distributed on the lower surface, wherein the plurality of injectors are in fluid communication with the gas plenum. A plurality of through holes extends from the upper surface to the lower surface. Selected ones of the plurality of through holes have a diameter that is different from a diameter of remaining ones of the plurality of through holes. The diameter of the selected ones of the plurality of through holes is predetermined in accordance with a desired ratio of respective gases provided via the selected ones of the plurality of through holes and the remaining ones of the plurality of through holes.

18 Claims, 6 Drawing Sheets

Related U.S. Application Data

(60) Provisional application No. 62/596,409, filed on Dec. 8, 2017.

(58) Field of Classification Search
CPC ........... H01J 37/32743; H01J 2237/334; H01J 2237/332; H01L 21/67017; H01L 21/02274; H01L 21/027; H01L 21/67276
USPC ............... 118/715, 723 I, 723 IR; 156/345.1, 156/345.48, 345.49, 345.31, 345.32
See application file for complete search history.

(56) References Cited

U.S. PATENT DOCUMENTS

| | | |
|---|---|---|
| 5,871,586 A | 2/1999 | Crawley et al. |
| 5,919,382 A | 7/1999 | Qian et al. |
| 5,994,662 A | 11/1999 | Murugesh |
| 6,036,878 A | 3/2000 | Collins |
| 6,054,013 A | 4/2000 | Collins et al. |
| 6,059,885 A | 5/2000 | Ohashi et al. |
| 6,089,472 A | 7/2000 | Carter |
| 6,148,761 A | 11/2000 | Majewski et al. |
| 6,200,412 B1 | 3/2001 | Kilgore et al. |
| 6,205,869 B1 | 3/2001 | Schadt et al. |
| 6,251,188 B1 | 6/2001 | Hashimoto et al. |
| 6,291,793 B1 | 9/2001 | Qian et al. |
| 6,306,247 B1 | 10/2001 | Lin |
| 6,364,949 B1 | 4/2002 | Or et al. |
| 6,387,182 B1 | 5/2002 | Horie et al. |
| 6,387,207 B1 | 5/2002 | Janakiraman et al. |
| 6,444,039 B1 | 9/2002 | Nguyen |
| 6,537,419 B1 | 3/2003 | Kinnard |
| 6,565,661 B1 | 5/2003 | Nguyen |
| 6,616,767 B2 | 9/2003 | Zhao et al. |
| 6,635,117 B1 | 10/2003 | Kinnard et al. |
| 6,727,654 B2 | 4/2004 | Ogawa et al. |
| 6,782,843 B2 | 8/2004 | Kinnard et al. |
| 6,820,570 B2 | 11/2004 | Kilpela et al. |
| 6,921,437 B1 | 7/2005 | DeDontney et al. |
| 7,156,921 B2 | 1/2007 | Byun |
| 7,186,395 B2 | 3/2007 | Walsdorff et al. |
| 7,296,534 B2 | 11/2007 | Fink |
| 7,479,303 B2 | 1/2009 | Byun |
| 7,601,242 B2 | 10/2009 | Fink |
| 7,846,291 B2 | 12/2010 | Otsuki |
| 7,850,779 B2 | 12/2010 | Ma et al. |
| 7,931,749 B2 | 4/2011 | Amikura et al. |
| 7,976,631 B2 | 7/2011 | Burrows et al. |
| 8,057,600 B2 | 11/2011 | Nishimoto et al. |
| 8,083,853 B2 | 12/2011 | Choi et al. |
| 8,187,679 B2 | 5/2012 | Dickey et al. |
| 8,231,799 B2 | 7/2012 | Bera et al. |
| 8,298,370 B2 | 10/2012 | Byun |
| 8,308,865 B2 | 11/2012 | Kim et al. |
| 8,328,939 B2 | 12/2012 | Choi et al. |
| 8,361,275 B2 | 1/2013 | Tahara et al. |
| 8,361,892 B2 | 1/2013 | Tam et al. |
| 8,419,959 B2 | 4/2013 | Bettencourt et al. |
| 8,512,509 B2 | 8/2013 | Bera et al. |
| 8,562,785 B2 | 10/2013 | Kang et al. |
| 8,608,852 B2 | 12/2013 | Mahadeswaraswamy et al. |
| 8,679,956 B2 | 3/2014 | Tam et al. |
| 8,721,791 B2 | 5/2014 | Tiner et al. |
| 8,764,902 B2 | 7/2014 | Suzuki et al. |
| 8,869,742 B2 | 10/2014 | Dhindsa et al. |
| 8,882,913 B2 | 11/2014 | Byun et al. |
| 9,057,128 B2 | 6/2015 | Olgado |
| 9,132,436 B2 | 9/2015 | Liang et al. |
| 9,224,581 B2 | 12/2015 | Mai et al. |
| 9,315,897 B2 | 4/2016 | Byun et al. |
| 9,349,619 B2 | 5/2016 | Kawamata et al. |
| 9,441,791 B2 | 9/2016 | Mizusawa et al. |
| 9,447,499 B2 | 9/2016 | Roy et al. |
| 9,476,121 B2 | 10/2016 | Byun et al. |
| 9,677,176 B2 | 6/2017 | Chandrasekharan et al. |
| 9,892,908 B2 | 2/2018 | Pettinger et al. |
| 9,978,564 B2 | 5/2018 | Liang et al. |
| 10,023,959 B2 | 7/2018 | Sung et al. |
| 10,077,497 B2 | 9/2018 | Tucker et al. |
| 10,316,409 B2 | 6/2019 | Van Schravendijk |
| 10,494,717 B2 | 12/2019 | Sung et al. |
| 10,604,841 B2 | 3/2020 | Batzer et al. |
| 11,015,247 B2 * | 5/2021 | Batzer ............... C23C 16/45565 |
| 11,053,587 B2 | 7/2021 | Van Schravendijk |
| 11,101,164 B2 | 8/2021 | Batzer et al. |
| 11,608,559 B2 | 3/2023 | Batzer et al. |
| 2002/0017243 A1 | 2/2002 | Pyo |
| 2002/0179012 A1 | 12/2002 | Takatsu et al. |
| 2003/0010451 A1 | 1/2003 | Tzu et al. |
| 2003/0019580 A1 | 1/2003 | Strang |
| 2003/0051665 A1 | 3/2003 | Zhao et al. |
| 2003/0054099 A1 | 3/2003 | Jurgensen et al. |
| 2003/0077388 A1 | 4/2003 | Byun |
| 2003/0151114 A1 | 8/2003 | Zyl |
| 2003/0205328 A1 | 11/2003 | Kinnard et al. |
| 2004/0031565 A1 | 2/2004 | Su et al. |
| 2004/0050326 A1 | 3/2004 | Thilderkvist et al. |
| 2004/0082251 A1 | 4/2004 | Bach et al. |
| 2004/0134611 A1 | 7/2004 | Kato et al. |
| 2004/0216665 A1 | 11/2004 | Soininen et al. |
| 2004/0216844 A1 | 11/2004 | Janakiraman et al. |
| 2004/0226507 A1 | 11/2004 | Carpenter et al. |
| 2005/0000430 A1 | 1/2005 | Jang et al. |
| 2005/0092248 A1 | 5/2005 | Lee et al. |
| 2005/0241579 A1 | 11/2005 | Kidd |
| 2005/0241763 A1 | 11/2005 | Huang et al. |
| 2005/0241765 A1 | 11/2005 | Dhindsa et al. |
| 2005/0241767 A1 | 11/2005 | Ferris et al. |
| 2006/0021703 A1 | 2/2006 | Umotoy et al. |
| 2006/0112876 A1 | 6/2006 | Choi et al. |
| 2006/0169201 A1 | 8/2006 | Hwang et al. |
| 2006/0191637 A1 | 8/2006 | Zajac et al. |
| 2006/0228496 A1 | 10/2006 | Choi et al. |
| 2006/0263522 A1 | 11/2006 | Byun |
| 2007/0068798 A1 | 3/2007 | Honda et al. |
| 2007/0089817 A1 | 4/2007 | Ganguli et al. |
| 2007/0110918 A1 | 5/2007 | Yuda et al. |
| 2007/0163440 A1 | 7/2007 | Kim et al. |
| 2007/0193515 A1 | 8/2007 | Jeon et al. |
| 2007/0202701 A1 | 8/2007 | Nakaya et al. |
| 2007/0215048 A1 | 9/2007 | Suzuki et al. |
| 2007/0264427 A1 | 11/2007 | Shinriki et al. |
| 2007/0272154 A1 | 11/2007 | Amikura et al. |
| 2008/0017315 A1 | 1/2008 | Fukuchi |
| 2008/0020146 A1 | 1/2008 | Choi et al. |
| 2008/0081114 A1 | 4/2008 | Johanson et al. |
| 2008/0081124 A1 | 4/2008 | Sano et al. |
| 2008/0124463 A1 | 5/2008 | Bour et al. |
| 2008/0156264 A1 | 7/2008 | Fair et al. |
| 2008/0156631 A1 | 7/2008 | Fair et al. |
| 2009/0008034 A1 | 1/2009 | Tahara et al. |
| 2009/0095222 A1 | 4/2009 | Tam et al. |
| 2009/0095621 A1 | 4/2009 | Kao et al. |
| 2009/0098276 A1 | 4/2009 | Burrows et al. |
| 2009/0169744 A1 | 7/2009 | Byun et al. |
| 2009/0178615 A1 | 7/2009 | Kim et al. |
| 2009/0178616 A1 | 7/2009 | Byun |
| 2009/0202721 A1 | 8/2009 | Nogami et al. |
| 2009/0223449 A1 | 9/2009 | Ishida |
| 2009/0236313 A1 | 9/2009 | Qiu et al. |
| 2009/0266911 A1 | 10/2009 | Kim et al. |
| 2009/0320756 A1 | 12/2009 | Tanaka |
| 2010/0003405 A1 | 1/2010 | Kappeler |
| 2010/0003406 A1 | 1/2010 | Lam et al. |
| 2010/0048028 A1 | 2/2010 | Rasheed et al. |
| 2010/0184298 A1 | 7/2010 | Dhindsa |
| 2010/0206845 A1 | 8/2010 | Hashimoto et al. |
| 2010/0261340 A1 | 10/2010 | Nijhawan et al. |
| 2010/0263588 A1 | 10/2010 | Zhiyin |
| 2010/0300359 A1 | 12/2010 | Armour et al. |
| 2011/0003087 A1 | 1/2011 | Soininen et al. |
| 2011/0023782 A1 | 2/2011 | Han |
| 2011/0039402 A1 | 2/2011 | Yamazaki et al. |
| 2011/0048325 A1 | 3/2011 | Choi et al. |

(56) References Cited

U.S. PATENT DOCUMENTS

| | | |
|---|---|---|
| 2011/0052833 A1 | 3/2011 | Hanawa et al. |
| 2011/0065276 A1 | 3/2011 | Ganguly et al. |
| 2011/0073038 A1 | 3/2011 | Chien et al. |
| 2011/0088847 A1 | 4/2011 | Law et al. |
| 2011/0097492 A1 | 4/2011 | Kerr et al. |
| 2011/0226181 A1 | 9/2011 | Yamamoto |
| 2011/0253044 A1 | 10/2011 | Tam et al. |
| 2011/0256315 A1 | 10/2011 | Tam et al. |
| 2011/0256692 A1 | 10/2011 | Tam et al. |
| 2011/0308551 A1 | 12/2011 | Chung et al. |
| 2012/0031559 A1 | 2/2012 | Dhindsa et al. |
| 2012/0052216 A1 | 3/2012 | Hanawa et al. |
| 2012/0067971 A1 | 3/2012 | Byun et al. |
| 2012/0135609 A1 | 5/2012 | Yudovsky et al. |
| 2012/0161405 A1 | 6/2012 | Mohn et al. |
| 2012/0225564 A1 | 9/2012 | Adachi et al. |
| 2012/0234945 A1 | 9/2012 | Olgado |
| 2012/0269968 A1 | 10/2012 | Rayner, Jr. |
| 2012/0321910 A1 | 12/2012 | Sneh |
| 2013/0052804 A1 | 2/2013 | Song |
| 2013/0093146 A1 | 4/2013 | Aihara et al. |
| 2013/0109159 A1 | 5/2013 | Carlson |
| 2013/0288485 A1 | 10/2013 | Liang et al. |
| 2013/0341433 A1 | 12/2013 | Roy et al. |
| 2014/0061324 A1 | 3/2014 | Mohn et al. |
| 2014/0097270 A1* | 4/2014 | Liang ............... C23C 16/452 239/548 |
| 2014/0103145 A1 | 4/2014 | White et al. |
| 2014/0127911 A1 | 5/2014 | Shih et al. |
| 2014/0179114 A1 | 6/2014 | van Schravendijk |
| 2014/0235069 A1* | 8/2014 | Breiling ............ H01J 37/32522 239/548 |
| 2014/0272185 A1 | 9/2014 | Na et al. |
| 2014/0299681 A1 | 10/2014 | Kashyap et al. |
| 2015/0004313 A1 | 1/2015 | Byun et al. |
| 2015/0007770 A1 | 1/2015 | Chandrasekharan et al. |
| 2015/0007771 A1 | 1/2015 | Silva et al. |
| 2015/0377481 A1 | 12/2015 | Smith et al. |
| 2015/0380221 A1 | 12/2015 | Liu et al. |
| 2016/0020074 A1 | 1/2016 | Mohn et al. |
| 2016/0032453 A1 | 2/2016 | Qian et al. |
| 2016/0148789 A1 | 5/2016 | Chen et al. |
| 2016/0168705 A1 | 6/2016 | Lind |
| 2016/0201193 A1 | 7/2016 | Saido |
| 2016/0340782 A1 | 11/2016 | Chandrasekharan et al. |
| 2016/0348242 A1 | 12/2016 | Sung et al. |
| 2017/0167024 A1 | 6/2017 | Wiltse et al. |
| 2017/0338134 A1* | 11/2017 | Tan ................... H01L 21/3065 |
| 2018/0096821 A1* | 4/2018 | Lubomirsky ..... H01J 37/32715 |
| 2018/0340256 A1 | 11/2018 | Sung et al. |
| 2019/0119815 A1 | 4/2019 | Park et al. |
| 2019/0301013 A1 | 10/2019 | Van Schravendijk |
| 2019/0352777 A1 | 11/2019 | Shankar et al. |
| 2020/0087789 A1 | 3/2020 | Mustafa et al. |
| 2020/0219757 A1 | 7/2020 | Breiling et al. |
| 2021/0371982 A1 | 12/2021 | Batzer et al. |
| 2023/0175134 A1 | 6/2023 | Batzer et al. |

FOREIGN PATENT DOCUMENTS

| | | |
|---|---|---|
| CN | 101405433 A | 4/2009 |
| CN | 101423936 A | 5/2009 |
| CN | 101423937 A | 5/2009 |
| CN | 101517704 A | 8/2009 |
| CN | 102424956 A | 4/2012 |
| CN | 102541102 A | 7/2012 |
| CN | 103403843 A | 11/2013 |
| CN | 103521956 A | 1/2014 |
| CN | 103890911 A | 6/2014 |
| CN | 103993293 A | 8/2014 |
| CN | 104278254 A | 1/2015 |
| CN | 104282530 A | 1/2015 |
| CN | 104342632 A | 2/2015 |
| CN | 104641457 A | 5/2015 |
| CN | 105185682 A | 12/2015 |
| CN | 106032571 A | 10/2016 |
| CN | 106906453 A | 6/2017 |
| CN | 106191814 B | 10/2018 |
| EP | 0709875 A1 | 5/1996 |
| EP | 0852392 A2 | 7/1998 |
| EP | 1496138 A1 | 1/2005 |
| EP | 1961837 A1 | 8/2008 |
| EP | 2187104 A1 | 5/2010 |
| EP | 2360292 B1 | 3/2012 |
| JP | H05186292 A | 7/1993 |
| JP | H08239775 A | 9/1996 |
| JP | 2000144421 A | 5/2000 |
| JP | 2002030445 A | 1/2002 |
| JP | 2002033311 A | 1/2002 |
| JP | 2003533878 A | 11/2003 |
| JP | 2005303292 A | 10/2005 |
| JP | 2006261217 A | 9/2006 |
| JP | 2006322074 A | 11/2006 |
| JP | 2006324400 A | 11/2006 |
| JP | 2007142363 A | 6/2007 |
| JP | 2007191792 A | 8/2007 |
| JP | 2007227789 A | 9/2007 |
| JP | 2007227829 A | 9/2007 |
| JP | 2008066413 A | 3/2008 |
| JP | 2008211219 A | 9/2008 |
| JP | 2009088232 A | 4/2009 |
| JP | 2010062383 A | 3/2010 |
| JP | 201084190 A | 4/2010 |
| JP | 2010192513 A | 9/2010 |
| JP | 2010232402 A | 10/2010 |
| JP | 2012500471 A | 1/2012 |
| JP | 2012533890 A | 12/2012 |
| JP | 2013174023 A | 9/2013 |
| JP | 2014220231 A | 11/2014 |
| JP | 2015529984 A | 10/2015 |
| JP | 2016128593 A | 7/2016 |
| JP | 2016531436 A | 10/2016 |
| JP | 2016219803 A | 12/2016 |
| JP | 2017112371 A | 6/2017 |
| KR | 20040079559 A | 9/2004 |
| KR | 20040091218 A | 10/2004 |
| KR | 100687373 B1 | 2/2007 |
| KR | 20070118836 A | 12/2007 |
| KR | 20080070125 A | 7/2008 |
| KR | 20110036322 A | 4/2011 |
| KR | 20110104434 A | 9/2011 |
| KR | 20140000168 A | 1/2014 |
| KR | 20140055078 A | 5/2014 |
| KR | 20140103080 A | 8/2014 |
| KR | 20160133373 A | 11/2016 |
| KR | 20220049926 A | 4/2022 |
| TW | 490705 B | 6/2002 |
| TW | 492045 B | 6/2002 |
| TW | 200710928 A | 3/2007 |
| TW | 201229300 A | 7/2012 |
| TW | 201411761 A | 3/2014 |
| TW | 201502310 A | 1/2015 |
| TW | 201509537 A | 3/2015 |
| WO | WO-0129282 A2 | 4/2001 |
| WO | WO-0188962 A1 | 11/2001 |
| WO | WO-2009055244 A1 | 4/2009 |
| WO | WO-2011009002 A2 | 1/2011 |
| WO | WO-2011011532 A2 | 1/2011 |
| WO | WO-2011044451 A2 | 4/2011 |
| WO | WO-2012122054 A2 | 9/2012 |
| WO | WO-2012166362 A1 | 12/2012 |
| WO | WO-2019113478 A1 | 6/2019 |
| WO | WO-2021127287 A1 | 6/2021 |

OTHER PUBLICATIONS

JP Office Action dated Jun. 6, 2023, in Application No. JP2020-531032 with English translation.
KR Office Action dated Jul. 28, 2023, in Application No. KR10-2020-7019670 with English Translation.
KR Office Action dated Oct. 13, 2023, in Application No. KR10-2022-7040495 with English translation.

(56) References Cited

OTHER PUBLICATIONS

U.S. Non-Final Office Action dated Sep. 8, 2023, in U.S. Appl. No. 18/163,828.
JP Office Action dated Jan. 16, 2024 in JP Application No. 2020-531032, with English Translation.
JP Office Action dated Nov. 21, 2023 in JP Application No. 2022-167262, with English Translation.
International Preliminary Report on Patentability and Written Opinion dated May 10, 2024 in PCT Application No. PCT/US2022/078786.
International Search Report and Written Opinion dated Jan. 2, 2024 in PCT Application No. PCT/US2023/074154.
KR Office Action dated Apr. 25, 2024 in KR Application No. 10-2022-7040495 with English translation.
KR Office Action dated Feb. 22, 2024 in KR Application No. 10-2020-7019670 with English translation.
U.S. Notice of Allowance dated Feb. 2, 2024 in U.S. Appl. No. 18/163,828.
U.S. Notice of Allowance dated Jan. 29, 2024 in U.S. Appl. No. 18/163,828.
U.S. Notice of Allowance dated May 3, 2024 in U.S. Appl. No. 18/163,828.
Cao, et al., "Development of a scanning probe microscopy integrated atomic layer deposition system for in situ successive monitoring of thin film growth" Review of Scientific Instruments 89, 123702 (2018) pp. 1-8. https://doi.org/10.1063/1.5042463.
Chen, et al., "Advances in Remote Plasma Sources for Cleaning 300 mm and Flat Panel CVD Systems" Semiconductor Magazine, , Aug. 2003, pp. 1-6.
Chinese First Office Action dated Jun. 18, 2020 issued in Application No. CN 201811101686.8.
Chinese Second Office Action dated Feb. 22, 2021 issued in Application No. CN 201811101686.8.
Chinese Third Office Action dated Aug. 2, 2021 issued in Application No. CN 201811101686.8.
CN Office Action dated Nov. 25, 2022 in Application No. CN201780077684.7 with English translation.
International Search Report and Written Opinion dated Feb. 2, 2021 in Application No. PCT/US2020/US55430.
International Preliminary Report on Patentability dated Apr. 28, 2022 issued in PCT/US2020/055430.
International Search Report and Written Opinion dated Apr. 9, 2018 issued in Application No. PCT/US2017/066411.
Japanese First Office Action dated Apr. 15, 2019 issued in Application No. JP 2018-087939.
Japanese First Office Action dated Feb. 13, 2018 issued in Application No. JP 2014-130967.
JP Office Action dated Dec. 6, 2022 in Application No. JP2020-531032 with English translation.
JP Office Action dated Dec. 21, 2021, in Application No. JP2019-531737 with English translation.
Korean Decision for Grant of Patent dated Jul. 29, 2020 issued in Application No. KR 10-2013-016139.
Korean First Office Action dated Aug. 28, 2019 issued in Application No. KR 10-2013-0071554.
Korean First Office Action dated Mar. 10, 2020 issued in Application No. KR 10-2013-0161939.
Korean First Office Action dated Nov. 18, 2020 issued in Application No. KR 10-2020-0142328.
KR Office Action dated Feb. 8, 2023 in Application No. KR10-2022-7040495 with English translation.
KR Office Action dated Feb. 15, 2022, in Application No. KR10-2019-7018989 with English Translation.
KR Office Action dated Sep. 22, 2022, in Application No. KR10-2022-7016307 with English translation.
Oviroh, Peter Ozaveshe, et al., "New development of atomic layer deposition: processes, methods and applications" Science and Technology of Advanced Materials (2019) vol. 20, No. 1, pp. 465-496. https://doi.org/10.1080/14686996.2019.1599694.
Paul, et al., "Anti reflection Coating on PM MA Substrates by Atomic Layer Deposition" Coatings 2020, 10, 64; pp. 1-13. doi: 10.3390/coatings 10010064Cpatomgs.
Taiwan First Office Action dated Jul. 3, 2018 issued in Application No. TW 107110096.
Taiwanese First Decision of Refusal dated Nov. 20, 2017 issued in Application No. TW 102147584.
Taiwanese First Office Action dated Aug. 7, 2019 issued in Application No. TW 105116200.
U.S Advisory Action dated Oct. 2, 2019 in U.S. Appl. No. 15/378,854.
U.S. Advisory Action dated Dec. 7, 2020 in U.S. Appl. No. 16/213,386.
US Advisory Action dated Dec. 6, 2018 issued in U.S. Appl. No. 13/934,620.
U.S. Final office Action dated Jul. 15, 2019 in U.S. Appl. No. 15/378,854.
US Final Office Action dated Jun. 22, 2017 issued in U.S. Appl. No. 13/934,620.
U.S. Final Office Action dated Oct. 13, 2020 in U.S. Appl. No. 16/213,386.
U.S. Final office Action dated Oct. 31, 2019 in U.S. Appl. No. 15/378,854.
US Final Office Action dated Sep. 13, 2018 issued in U.S. Appl. No. 13/934,620.
U.S. Non-Final office Action dated Mar. 5, 2019 in U.S. Appl. No. 15/378,854.
U.S. Non-Final Office Action dated Jun. 22, 2020 in U.S. Appl. No. 16/213,386.
U.S. Notice of Allowance dated Nov. 20, 2019 in U.S. Appl. No. 15/378,854.
U.S. Notice of Allowance dated Apr. 15, 2021, in U.S. Appl. No. 16/820,003.
U.S. Notice of Allowance dated Feb. 3, 2021 in U.S. Appl. No. 16/213,386.
US Notice of Allowance dated Feb. 11, 2019 issued in U.S. Appl. No. 13/842,054.
US Notice of Allowance dated Jul. 30, 2019 issued in U.S. Appl. No. 16/035,491.
US Notice of allowance dated Mar. 22, 2019 issued in U.S. Appl. No. 16/035,491.
US Notice of Allowance dated Mar. 3, 2021 issued in U.S. Appl. No. 16/434,043.
US Notice of Allowance dated Mar. 8, 2018 issued in U.S. Appl. No. 13/934,620.
US Notice of Allowance dated May 30, 2018 issued in U.S. Appl. No. 13/842,054.
U.S. Notice of Allowance dated Nov. 3, 2022 in U.S. Appl. No. 17/401,261.
US Office Action dated Nov. 20, 2017 issued in U.S. Appl. No. 13/934,620.
US Office Action dated Nov. 28, 2018, issued in U.S. Appl. No. 16/035,491.
US Office Action dated Oct. 12, 2016 issued in U.S. Appl. No. 13/934,620.
U.S. Appl. No. 17/754,853, Inventors Thomas et al., filed Apr. 13, 2022.
U.S. Appl. No. 18/163,828, inventors Batzer et al., filed Feb. 2, 2023.
U.S. Restriction Requirement dated Dec. 11, 2018 in U.S. Appl. No. 15/378,854.
International Search Report and Written Opinion Corresponding to Application No. PCT/US2018/064524 dated Apr. 1, 2019, 10 pages.
US Office Action dated Oct. 20, 2017 issued in U.S. Appl. No. 13/842,054.
US Notice of Allowance dated Mar. 8, 2018 issued in U.S. Appl. No. 15/163,594.
Chinese Fourth Office Action dated Sep. 13, 2017 issued in Application No. CN 201410052998.X.
Japanese First Office Action dated Nov. 7, 2017 issued in Application No. JP 2014-021856.
Chinese First Office Action dated Apr. 10, 2018 issued in Application No. CN 201610361563.2.

(56) References Cited

OTHER PUBLICATIONS

US Office Action dated Apr. 12, 2017 issued in U.S. Appl. No. 13/842,054.
US Notice of Allowance dated Apr. 14, 2017 issued in U.S. Appl. No. 13/934,597.
Taiwan Examination and Search Report dated Apr. 11, 2017 issued in Application No. TW 102147584.
Chinese Third Office Action dated Mar. 2, 2017 issued in Application No. CN 201410052998.X.
Taiwan Examination and Search Report dated May 12, 2017 issued in Application No. TW 103104956.
U.S. Appl. No. 13/842,054, filed Mar. 15, 2013, entitled "Radical Source Design for Remote Plasma Atomic Layer Deposition."
U.S. Appl. No. 13/934,597, filed Jul. 3, 2013, entitled "Multi-Plenum, Dual-Temperature Showerhead."
US Office Action dated Dec. 3, 2015 issued in U.S. Appl. No. 13/842,054.
US Final Office Action dated May 18, 2016 issued in U.S. Appl. No. 13/842,054.
US Office Action dated Sep. 8, 2016 issued in U.S. Appl. No. 13/842,054.
US Office Action dated Apr. 7, 2016 issued in U.S. Appl. No. 13/934,597.
US Final Office Action dated Sep. 16, 2016 issued in U.S. Appl. No. 13/934,597.
US Notice of Allowance dated Jan. 10, 2017 issued in U.S. Appl. No. 13/934,597.
US Office Action dated Mar. 13, 2015 issued in U.S. Appl. No. 13/531,254.
US Office Action datedSep. 17, 2015 issued in U.S. Appl. No. 13/531,254.
US Notice of Allowance dated Jan. 15, 2016 issued in U.S. Appl. No. 13/531,254.
US Notice of Allowance dated May 12, 2016 issued in U.S. Appl. No. 13/531,254.
Chinese First Office Action dated Dec. 9, 2015 issued in Application No. CN 20140052988.X.
Chinese Second Office Action dated Jul. 27, 2016 issued in Application No. CN 20140052988.X.
Singapore Search Report and Written Opinion dated Jul. 7, 2015 issued in Application No. SG 201401171-2.
Singapore Final Examination Report dated Jan. 12, 2016 issued in Application No. SG 201401171-2.
Chinese First Office Action dated Mary 2, 2016 issued in Application No. CN 201410312720.1.
Taiwan Examination and Search Report dated Oct. 13, 2016 issued in Application No. TW 102122169.
CN Office Action dated Jun. 3, 2024 in CN Application No. 201880079245.4 with English translation.
JP Office Action dated Jul. 30, 2024 in JP Application No. 2020-531032, with English Translation.

\* cited by examiner

INTEGRATED SHOWERHEAD WITH IMPROVED HOLE PATTERN FOR DELIVERING RADICAL AND PRECURSOR GAS TO A DOWNSTREAM CHAMBER TO ENABLE REMOTE PLASMA FILM DEPOSITION

CROSS-REFERENCE TO RELATED APPLICATIONS

The present disclosure is a continuation of U.S. patent application Ser. No. 16/213,386, filed on Dec. 7, 2018 (now U.S. Pat. No. 11,015,247), claims the benefit of U.S. Provisional Application No. 62/596,409, filed on Dec. 8, 2017. The present disclosure is related to commonly assigned U.S. patent application Ser. No. 15/378,854, filed on Dec. 14, 2016 (now U.S. Pat. No. 10,604,841). The entire disclosures of the applications referenced above are incorporated herein by reference.

FIELD

The present disclosure relates to substrate processing systems, and more particularly to substrate processing systems including showerheads that deliver radicals and precursor gas to a downstream chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit film on a substrate such as a semiconductor wafer. The substrate processing systems typically include a processing chamber and a substrate support. During film deposition, radicals and precursor gas are supplied to the processing chamber.

For example, the processing chamber may include an upper chamber, a lower chamber and a substrate support. A showerhead may be arranged between the upper chamber and the lower chamber. The substrate is arranged on the substrate support in the lower chamber. A plasma gas mixture is supplied to the upper chamber and plasma is struck in the upper chamber. Some of the radicals generated by the plasma flow through the showerhead to the lower chamber. The showerhead filters ions and shields UV light from reaching the lower chamber. A precursor gas mixture is supplied to the lower chamber through the showerhead and reacts with the radicals to deposit film on the substrate.

SUMMARY

A showerhead for a substrate processing system includes a lower surface, a plasma-facing upper surface, a gas plenum defined between the lower surface and the upper surface, and a plurality of injectors distributed on the lower surface, wherein the plurality of injectors are in fluid communication with the gas plenum. A plurality of through holes extends from the upper surface to the lower surface. Selected ones of the plurality of through holes have a diameter that is different from a diameter of remaining ones of the plurality of through holes. The diameter of the selected ones of the plurality of through holes is predetermined in accordance with a desired ratio of respective gases provided via the selected ones of the plurality of through holes and the remaining ones of the plurality of through holes.

In other features, the selected ones of the plurality of through holes include a first type of through hole having an average diameter satisfying a predetermined ratio relationship with an average diameter of the remaining ones of the plurality of through holes. The selected ones of the plurality of through holes includes at least a first type of through hole satisfying a first predetermined ratio relationship with an average diameter of the remaining ones of the plurality of through holes and a second type of through hole satisfying a second predetermined ratio relationship with an average diameter of the remaining ones of the plurality of through holes. The diameter of the selected ones of the plurality of through holes is predetermined in accordance with deposition non-uniformities associated with showerhead.

In other features, on the lower surface of the showerhead, the through holes are arranged in a plurality of groups each including two or more of the through holes distributed around a respective one of the plurality of injectors. On the lower surface of the showerhead, the through holes are arranged in a plurality of groups each including three of the through holes distributed around a respective one of the plurality of injectors. The three of the through holes in each of the plurality of groups are distributed in a triangle configuration around the respective one of the plurality of injectors. The three of the through holes in each of the plurality of groups are radially distributed around the respective one of the plurality of injectors.

In other features, the plurality of through holes includes at least one central group of through holes and a first plurality of groups of the through holes arranged in a first hexagonal pattern around the at least one central group. A second plurality of groups of the through holes is arranged in a second hexagonal pattern around the first plurality of groups. The plurality of through holes includes at least one central group and a first plurality of groups of the through holes arranged in a first circular pattern around the at least one central group. At least one second plurality of groups of the through holes is arranged in a second circular pattern around the first plurality of groups.

In other features, the plurality of through holes includes a plurality of groups of the through holes, the plurality of groups of through holes includes at least one central group, and remaining groups of the plurality of groups are arranged in an increasing 6 pattern around the at least one central group. The plurality of through holes includes a plurality of groups of the through holes, the plurality of groups of through holes includes at least one central group, and remaining groups of the plurality of groups are arranged in an increasing 8 pattern around the at least one central group. A plurality of gas injector nozzles extends downward from respective ones of the injectors. The plurality of through holes includes 85 groups of the through holes.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Typically, a showerhead in a substrate processing system does not have a thermal control system. However, in some processing systems, a basic thermal control system is used to control a temperature of an outer edge of the showerhead, which is accessible and not under vacuum. The basic thermal control system does not uniformly control temperature across the showerhead due to the heat from the plasma. In other words, the temperature at the center of the showerhead increases. Temperature changes also occur with process changes such as plasma on/off, pressure, flow rate, and/or pedestal temperature. Variations in the temperature of the showerhead adversely impact the uniformity of the deposition process and defect performance. The location, arrangement and size of through holes and gas injectors in the showerhead also may adversely affect deposition uniformity A showerhead according to the present disclosure includes a predetermined pattern of precursor injectors and through holes for radicals. The pattern and sizing of the through holes impacts on-wafer deposition rates and distribution. The showerhead is typically circular to match a shape of a substrate to be processed. It is often difficult to uniformly arrange the precursor injectors and through holes in all of the desired locations of the showerhead. Standard patterns of the precursor injectors and through holes for the radicals tend to create non-uniform deposition patterns in either azimuthal and/or radial directions.

The present disclosure relates to a substrate processing system including a showerhead including a predetermined pattern and sizing of precursor injectors and through holes for radicals to provide more uniform deposition performance. In some examples, the arrangements and sizing variations disclosed herein reduce showerhead-caused deposition variation by up to approximately 50%.

The showerhead provides uniform temperature control by supplying heat transfer fluid to channels through a center portion of the showerhead to maintain a uniform and controlled temperature. The showerhead also supplies uniform precursor gas flow delivery to a chamber including the substrate. In some examples, the substrate processing system can be used to deposit conformal carbide films, although other types of film can be deposited.

Figure 1:
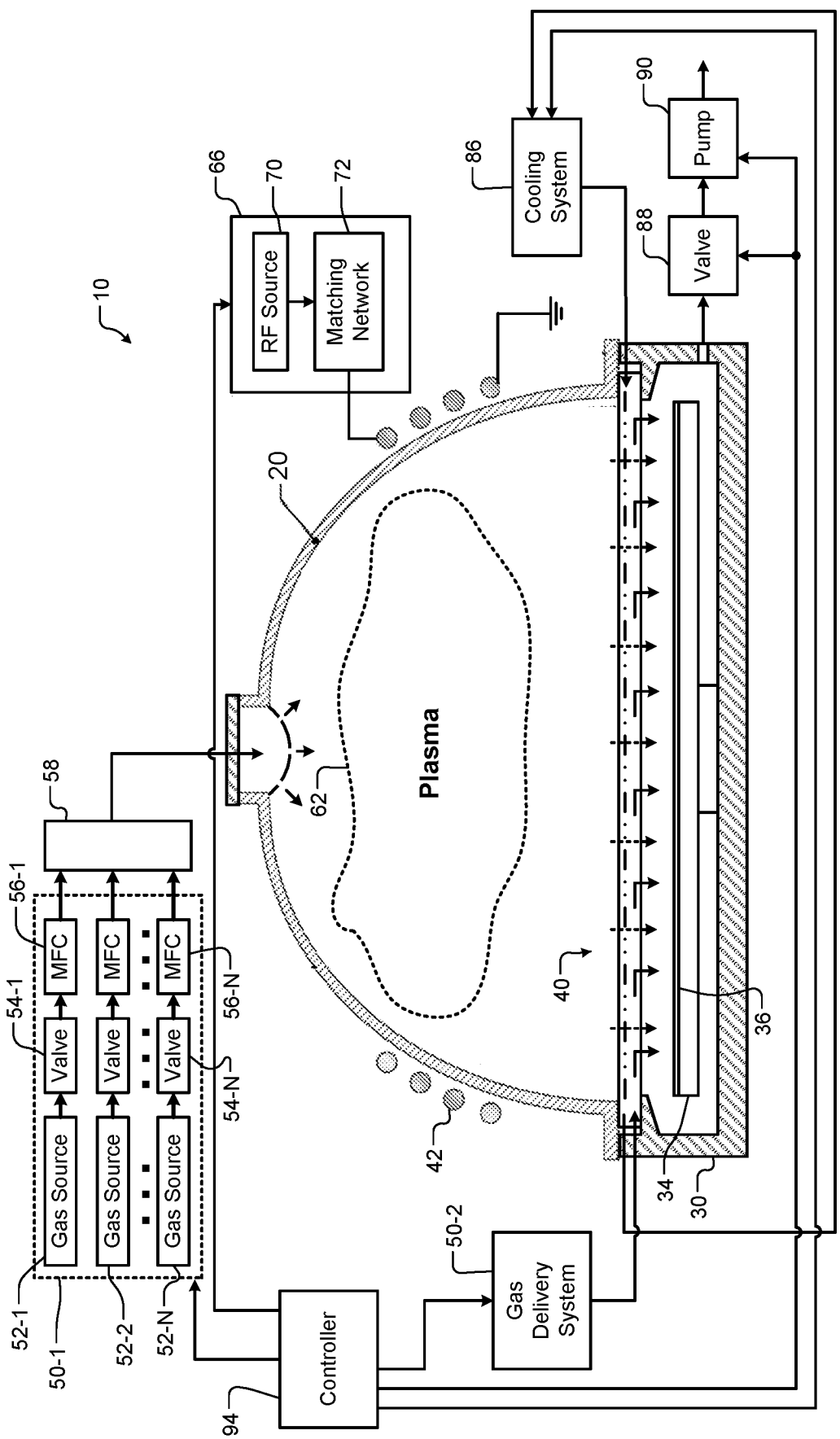
FIG. 1 is a functional block diagram of an example of a substrate processing chamber including a showerhead according to the present disclosure.

Referring now to FIG. 1, a substrate processing system 10 includes an upper chamber 20 and a lower chamber 30. While a specific type of substrate processing system is shown and described herein, other types and/or arrangements may be used. While inductively coupled plasma is shown, other types of plasma generation may be used such as capacitively coupled plasma, remote plasma sources, or other suitable plasma generators.

In some examples, the upper chamber 20 may include a dome shaped chamber, although other chamber shapes can be used. A substrate support 34 is arranged in the lower chamber 30. A substrate 36 is arranged on the substrate support 34 during substrate treatment. A showerhead 40 is arranged between the upper chamber 20 and the lower chamber 30. Inductive coils 42 may be arranged around the upper chamber 20. The showerhead 40 defines a heat transfer plenum (an example of the heat transfer plenum is shown in FIG. 6) to cool the showerhead and a gas plenum (an example of the gas plenum is shown in FIG. 7) to deliver precursor gas to the lower chamber 30.

A gas delivery system 50-1 may be used to supply a process gas mixture including plasma gas to the upper chamber 20. The gas delivery system 50-1 includes one or more gas sources 52-1, 52-2, ..., and 52-N, valves 54-1, ..., and 54-N, mass flow controllers (MFC) 56-1, ..., and 56-N, and a manifold 58, although other types of gas delivery systems can be used (where N is an integer). A gas delivery system 50-2 delivers a process gas mixture including precursor gas to the showerhead 40.

An RF plasma generator 66 includes an RF source 70 and a matching network 72. The RF plasma generator 66 selectively supplies RF power to the inductive coil 42 (while plasma gas is supplied) to generate plasma 62 in the upper chamber 20.

A thermal control system 86 may be used to supply heat transfer fluid such gas or a liquid coolant to the showerhead 40 to control a temperature of the showerhead 40. A valve 88 and a pump 90 may be used to evacuate reactants.

A controller 94 communicates with the gas delivery systems 50-1 and 50-2 to selectively supply process gases as needed to the upper chamber 20 and the showerhead 40. The controller 94 communicates with the RF plasma generator 66 to generate and extinguish plasma in the upper chamber 20.

The controller 94 communicates with the thermal control system 86 to control a flow rate and temperature of heat transfer fluid. The heat transfer fluid is used to control the temperature of the showerhead 40. In some examples, the heat transfer fluid may include water, water mixed with ethylene glycol, perfluoropolyether fluorinated fluid or other fluid and/or one or more gases. In some examples, the thermal control system 86 controls the flow rate or temperature of the heat transfer fluid using a closed loop control system. In other examples, the thermal control system 86 controls the flow rate and temperature using proportional integral derivative (PID) control. The heat transfer fluid may be provided in an open loop system from a water circulation system. In some examples, the heat transfer fluid is hermetically sealed from the vacuum chamber.

In some examples, the controller 94 may be connected to one or more temperature sensors (not shown) arranged in the showerhead 40 to sense one or more temperatures of the showerhead 40. In some examples, the controller 94 may be connected to one or more pressure sensors (not shown) arranged in the showerhead 40 to sense one or more pressures in the processing chamber. The controller 94 communicates with the valve 88 and the pump 90 to control pressure within the upper and lower chambers 20, 30 and to selectively evacuate reactants therefrom.

Figure 2:
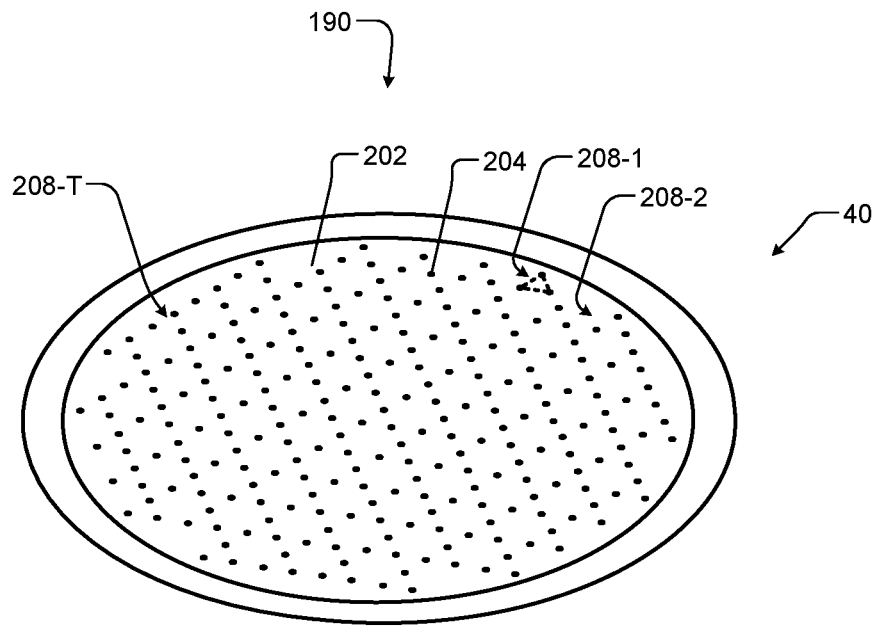
FIG. 2 is a top perspective view of an example of the showerhead according to the present disclosure.
Figure 3:
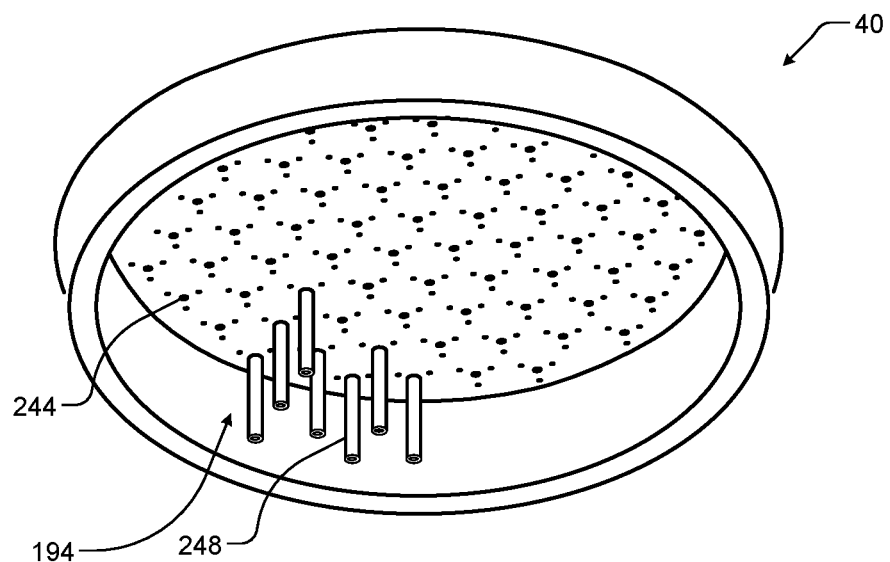
FIG. 3 is a bottom perspective view of an example of the showerhead according to the present disclosure.

Referring now to FIGS. 2 and 3, perspective views of an upper surface 190 and a lower surface 194 of the showerhead 40 are shown, respectively. The showerhead 40 includes a plasma-facing surface 202 including a plurality of through holes 204. In some examples, the plasma-facing surface 202 is circular, although other shapes can be used. In some examples, the plasma-facing surface 202 has a diameter of approximately 400 mm, although other diameters may be used.

Figure 4:
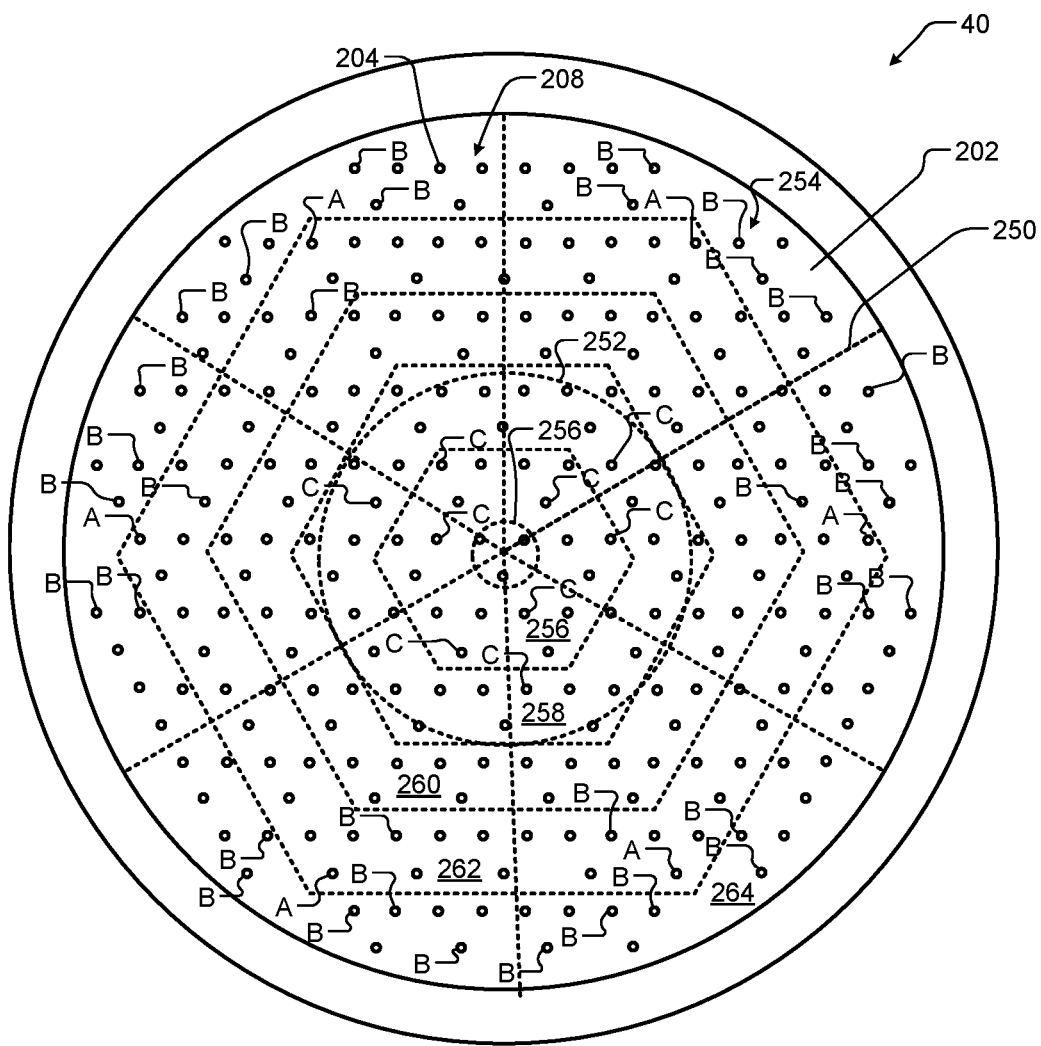
FIG. 4 is a plan view of an example of the showerhead according to the present disclosure.

In some examples, the through holes 204 extend from the upper surface 190 of the showerhead 40 to the lower surface 194 of the showerhead. In some examples, the through holes 204 are arranged in groups 208-1, 208-2, . . . , and 208-T (collectively groups of through holes 208), where each of the groups includes R through holes, where R and T are integers greater than one. In other examples, R is one. In this example, each of the groups of through holes 208 includes three through holes 204 that are arranged in a triangle configuration, although other shapes and numbers of through holes can be used. In some examples, the groups of through holes 208 are arranged in a hexagonal pattern which is best seen in FIG. 4. In the triangle based pattern, the through holes may be arranged in a half-spaced triangle pattern or arranged radially around each injector. In another example pattern, the through holes are arranged radially around each injector (e.g., in a circular based pattern).

A precursor gas is supplied to a gas plenum (not shown) located inside of the showerhead 40. The precursor gas exits the gas plenum via a plurality of injectors 244. In some examples, each of the plurality of injectors 244 includes a restricted orifice. In some examples, each of the groups of through holes 208 includes at least one of the plurality of injectors 244. Each of the through holes 204 in a given one of the groups 208 is nearer to an associated one of the injectors 244 (i.e., an injector that the group 208 is clustered around) than to any others of the injectors 244. As shown in FIG. 3, gas injector nozzles 248 may be arranged on respective ones of the injectors 244. The nozzles 248 extend downward from the injectors 244. Although only several of the nozzles 248 are shown for example purposes, each of the injectors 244 may have a respective one of the nozzles 248.

The showerhead 40 can be made of multiple layers that are connected together. More layers may be added to create additional plenums. In some examples, the showerhead 40 can be manufactured using vacuum brazing, tungsten inert gas (TIG) welding, or electron beam welding to enable complex and unique geometries at a reasonable cost. Vacuum braze joining allows the showerhead to be machined as flat plates with grooves cut into the plates with a layer of braze between each plate. Welding techniques require more complex sub-components for the weld to access all areas which require sealing. Posts and corresponding holes may be machined to raise the sealing area to the surface of the part where it is accessible to weld.

Referring now to FIG. 4, selected ones of the through holes 204 have diameters that are sized differently to alter/adjust the delivery of radicals. Each of the through holes 204 that are not labeled either A, B or C are the nominal type and have a nominal diameter dimension that will be described further below. The through holes 204 that are labeled type A, B or C have a different diameter dimension than the nominal diameter dimension as will be described further below.

In some examples, for the types A, B and C, the average size follows a predetermined ratio $(D_{avg\_typeX})^4/(D_{avg\_nom})^4 = ratio +/- 0.01"$, where $D_{avg\_typeX}$ is the average diameter of the type X (which can be either A or B or C in our example) and $D_{avg\_nom}$ is the average diameter of type nominal. In some examples, the ratio for type A is in a range of 1.3 to 1.6. In some examples, the ratio for type B is in a range of 0.8 to 1.0. In some examples, the ratio for type C is in a range of 1.0 to 1.2. As can be appreciated other combinations of hole sizes can achieve the same overall showerhead flow distribution. The foregoing example corrects for the azimuthal non-uniformity of a triangular pattern in a circular chamber. The hole size ratios can also be modulated radially to change the radial uniformity of deposition on the substrate. For example, for substrate processing systems configured to provide two or more different gases via the showerhead 40, modulating the hole size ratios corresponding to the different gases as described above changes a ratio between the amounts of the gases flowing out of the showerhead and into the processing chamber. In this manner, the hole size ratios can be adjusted to modulate a reactant ratio in specific regions and correct on wafer non-uniformities. In some examples, diameters of the injectors 244 (and/or respective nozzles 248) may be changed to modulate gas flow ratios in a similar manner. However, since there is a significantly greater number of the through holes 204 than injectors 244, changing diameters of the through holes 204 facilitates finer tuning of gas flow ratios.

In the example in FIG. 4, there are a total of 85 injectors 244 and a corresponding number of groups of through holes 204. Some of the through holes 204 located in a radially inner portion 252 of the plasma-facing surface 202 are type C. Some of the through holes 204 located in a radially outer portion 254 of the plasma-facing surface 202 are type A and type B. In some examples, 9 of the through holes 204 are selected to be type C. In some examples, 36 of the through holes 204 are selected to be type B. In some examples, six of the through holes 204 are selected to be type A. In some examples, 6 type B through holes and 1 type A through hole are arranged in each of six 60 degree pie-shaped slices 250.

Gas injectors are arranged in a circular bore with a center injector and repeated pattern around it. In FIG. 4, a single, central group 256 is surrounded by 6, 12, 18, 24 and 24 groups in respective concentric hexagonal regions for a total of 85 groups. For example, as shown in FIG. 4, the group 256 is surrounded by 6 triangular groups in a first hexagonal region 258. A second hexagonal region 260 includes 12 triangular groups. A third hexagonal region 262 includes 18 triangular groups. A fourth hexagonal region 264 and a fifth hexagonal region 266 each include 24 triangular groups. While the pattern of through holes around the gas injector includes 85 groups of through holes, the pattern can be changed in increments of 6 (i.e., a 6 increasing pattern where each successive surrounding region has 6 more groups than an adjacent inner region). Alternate patterns include a radial pattern with a 6 or 8 increasing pattern. A radial pattern with a 6 increasing pattern includes 61, 91, 127, or 169 injectors. A radial pattern with an 8 increasing pattern includes 81, 121, or 169 injectors. In some examples, the nominal type has a dimension of 0.06" to 0.40". The nominal hole diameter may be dependent on a pressure drop required for the flow, gas, and pressure conditions to enable flow distribution to be controlled with the through holes 204 without being dominated by other chamber geometry. Hole diameter may also be dependent upon desired flow rate, pressure, and gas species to prevent back diffusion of precursor gasses into the upper chamber 20.

Figure 5:
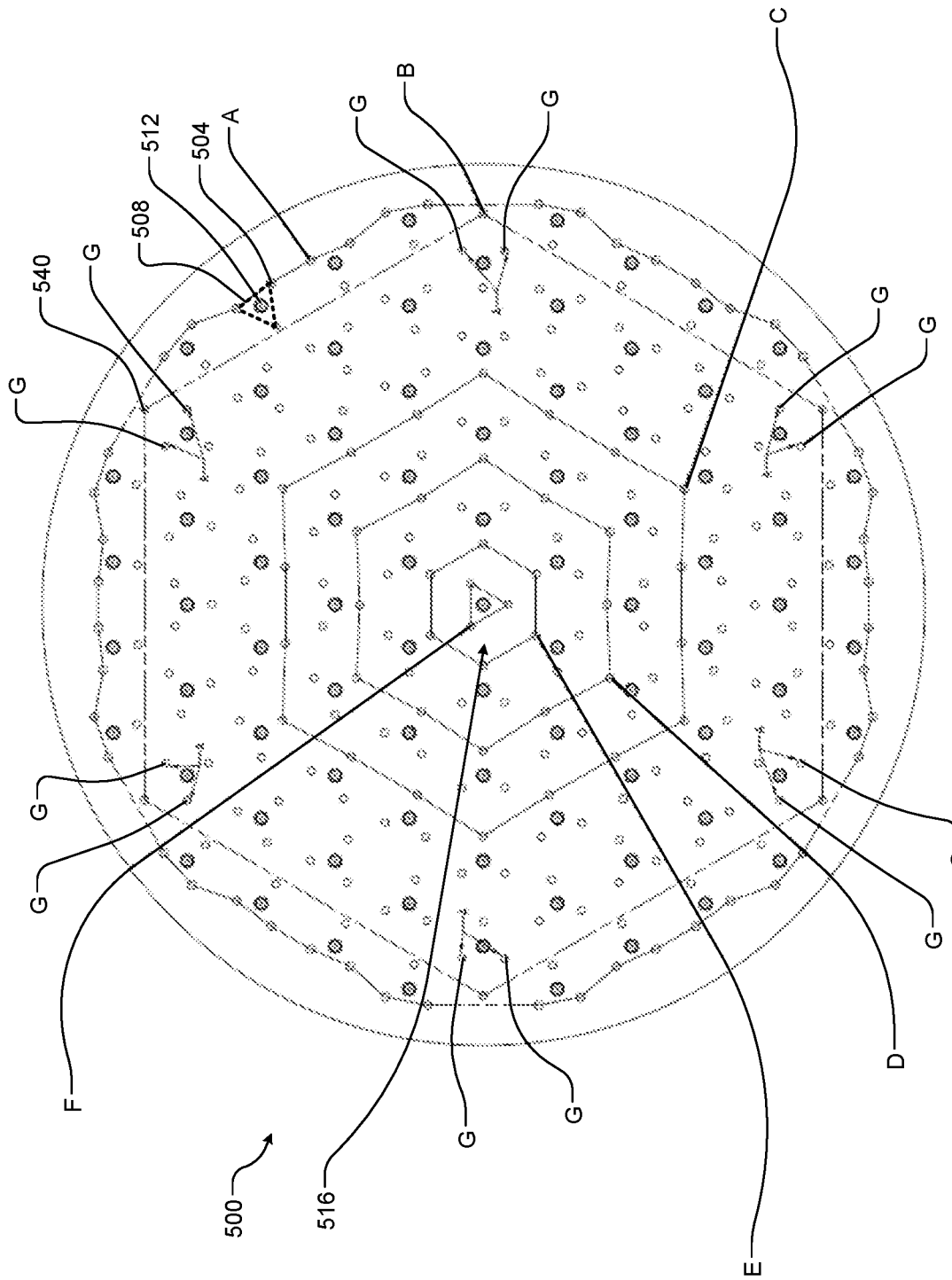
FIG. 5 illustrates a bottom view of another example showerhead according to the present disclosure.

FIG. 5 shows an example bottom view of a showerhead 500 according to the present disclosure. In this example, through holes 504 are arranged in a triangle based pattern in groups 508 clustered around respective injectors 512. A central group 516 is surrounded by successive hexagonal rings of 6 of the groups 508, 12 of the groups 508, 18 of the groups 508, 24 of the groups 508, and 24 of the groups 508, respectively. In this example, the outermost hexagonal ring of the groups 508 also includes additional through holes 540 not associated with a particular one of the groups 508 clustered around a respective one of the injectors 512.

Instead, the through holes 540 are arranged in gaps in the pattern of the groups 508 in the outermost hexagonal ring. Although referred to as "rings," the groups 508 are arranged in successive hexagonal patterns similar to the manner shown in FIG. 4.

Similar to the example described in FIG. 4, selected ones of the through holes 504 and 540 have diameters that are sized differently to alter/adjust the delivery of radicals as shown in FIG. 5. In this example, each of the through holes 504 and 540 that are not labeled either A, B, C, D, E, F (as indicated by the respective one of the profiles A-F connecting the respective through holes in FIG. 5), or G are the nominal type and have a nominal diameter dimension that will be described further below. The through holes 504 or 540 that are labeled type A, B or C have a different diameter dimension than the nominal diameter dimension as will be described further below.

In some examples, for the types A, B C, D, E, F, and G, the average size follows a predetermined ratio (Davg_typeX)$^4$/(Davg_nom)$^4$=ratio+/−0.01", where Davg_typeX is the average diameter of the type X (which can be either A, B C, D, E, F, or G in our example) and Davg_nom is the average diameter of type nominal. In some examples, the ratio for type A is in a range of 1.3 to 1.6. In some examples, the ratio for type B is in a range of 1.1 to 1.4. In some examples, the ratio for type C is in a range of 1.1 to 1.4. In some examples, the ratio for type D is in a range of 1.1 to 1.4. In some examples, the ratio for type E is in a range of 1.2 to 1.5. In some examples, the ratio for type F is in a range of 0.7 to 1.0. In some examples, the ratio for type G is in a range of 0.7 to 1.0.

As can be appreciated other combinations of hole sizes can achieve the same overall showerhead flow distribution. The hole size ratios can also be modulated radially to change the radial uniformity of deposition on the substrate. In this manner, the hole size ratios can be adjusted to modulate a reactant ratio in specific regions and correct on wafer non-uniformities.

Figure 6A:
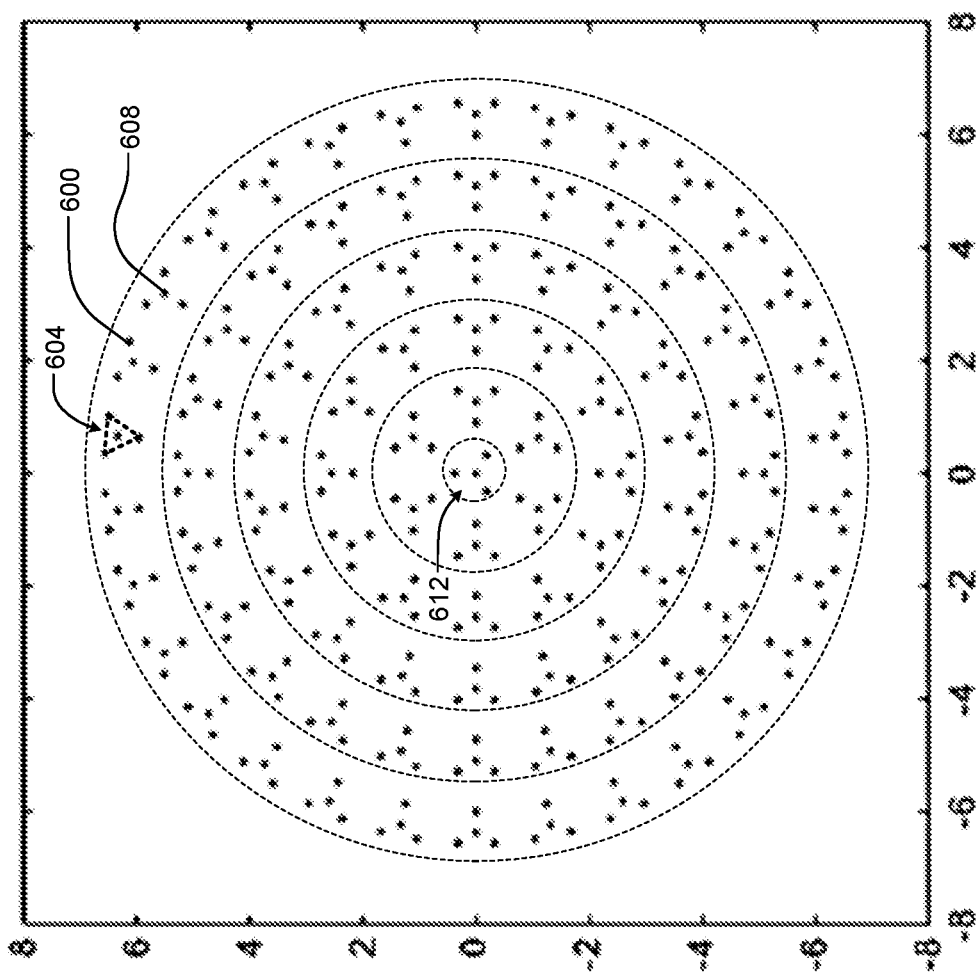
FIGS. 6A, 6B, and 6C illustrate other example hole patterns according to the present disclosure.
Figure 6C:
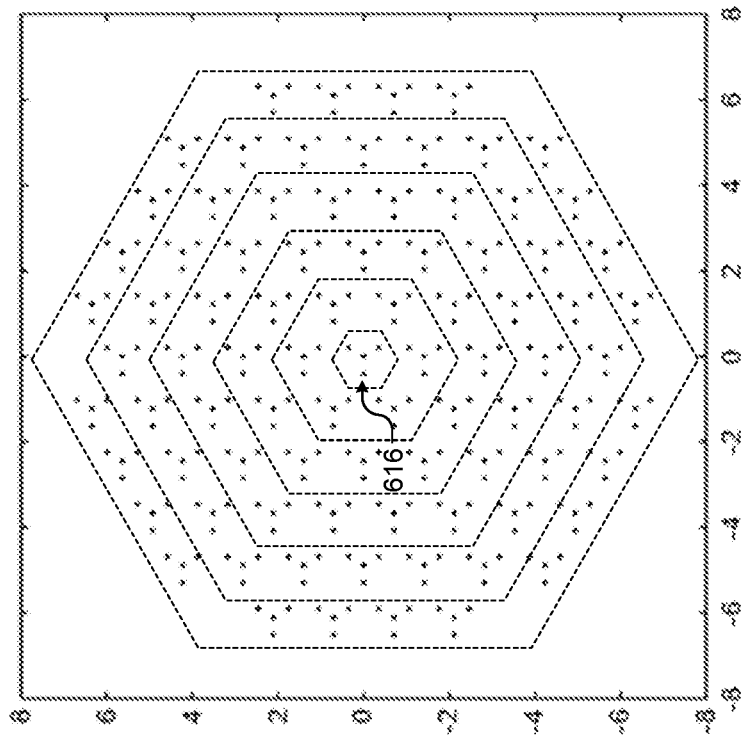
Figure 6B:
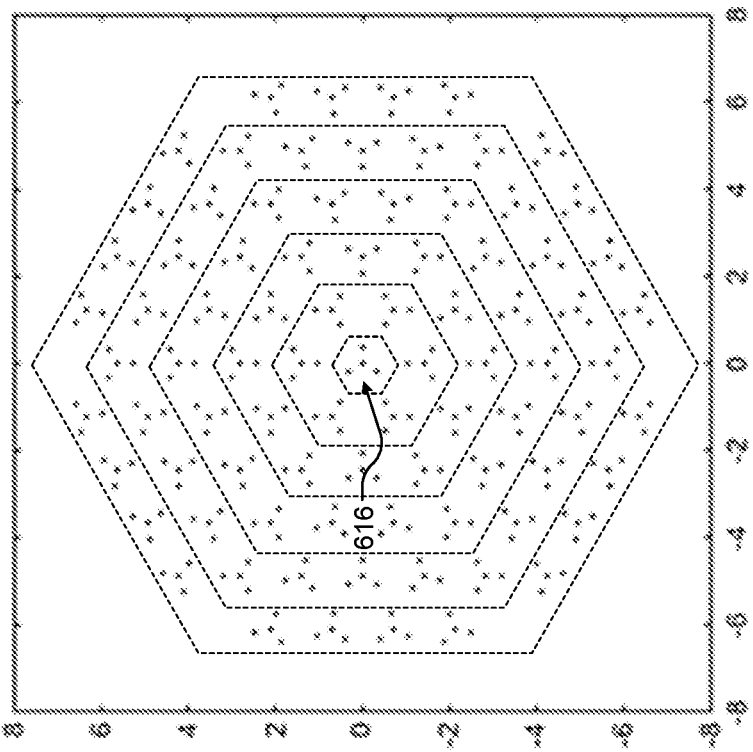

FIGS. 6A, 6B, and 6C illustrate other example hole patterns according to the present disclosure. In FIG. 6A, through holes 600 are arranged in a triangle based pattern in groups 604 clustered around respective injectors 608. A central group 612 is surrounded by 5 successive circular regions including 6, 12, 18, 24, and 30 of the groups 604, respectively (i.e., in a 6 increasing pattern). In each of FIGS. 6B and 6C, a central group 616 is surrounded by 5 successive hexagonal regions including 6, 12, 18, 24, and 24 of the groups 604, respectively.

In the examples shown in FIGS. 6A, 6B, and 6C, diameters of selected ones of the through holes 600 may be sized differently to alter/adjust the delivery of radicals in a manner similar to that described in FIGS. 4 and 5D. In other words, selected ones of the through holes 600 of a type X have a different diameter dimension than a nominal diameter dimension of the through holes 600. For example, selected ones of the through holes 600 have an average size that follows a predetermined ratio (Davg_typeX)$^4$/(Davg_nom)$^4$=ratio+/−0.01", where Davg_typeX is the average diameter of the type X and Davg_nom is the average diameter of type nominal. In this manner, the hole size ratios can be adjusted to modulate a reactant ratio in specific regions and correct on wafer non-uniformities as described above in more detail.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A showerhead for a substrate processing system, the showerhead comprising:
   an upper surface;
   a lower surface;
   a gas plenum defined between the upper surface and the lower surface;
   a plurality of through holes that extend from the upper surface to the lower surface, wherein the plurality of through holes comprise a plurality of first through holes and a plurality of nominal through holes, wherein diameters of the first through holes are different than diameters of the nominal through holes, wherein the plurality of through holes is in fluid communication with volume above the upper surface and a volume below the lower surface;
   a plurality of injectors distributed on the lower surface, wherein (i) the plurality of injectors is in fluid communication with the gas plenum such that gas exits from the gas plenum inside the showerhead through the plurality of injectors and (ii) the plurality of injectors does not extend through the upper surface; and
   a plurality of gas injector nozzles that extend downward from the lower surface, the plurality of gas injector nozzles aligned with and extending from respective ones of the injectors such that gas exits from the plurality of gas injector nozzles to a volume below the showerhead, wherein, on the lower surface of the showerhead, the plurality of through holes is located in a plurality of separate groups each comprising three through holes distributed in a triangular pattern around a respective one of the plurality of injectors;
   wherein the plurality of first through holes comprise a primary type of through holes that have a first diameter, a secondary type of through holes that have a second diameter, and a tertiary type of through holes that have a third diameter, wherein an average diameter of the primary type of through holes satisfies a first predetermined ratio relative to an average diameter of the nominal through holes $(Davg\_primary)^4/(Davg\_nominal)^4$, wherein an average diameter of the secondary type of through holes satisfies a predetermined ratio relative to the average diameter of the nominal through holes $(Davg\_secondary)^4/(Davg\_nominal)^4$, and wherein an average diameter of the tertiary type of through holes satisfies a predetermined ratio relative to the average diameter of the nominal through holes $(Davg\_tertiary)^4/(Davg\_nominal)^4$.

2. The showerhead of claim 1, wherein at least some of the first through holes are positioned at different radial distances relative to one another from a center of the showerhead.

3. The showerhead of claim 1, wherein the first predetermined ratio is 1.3 to 1.6.

4. The showerhead of claim 3, wherein the second predetermined ratio is 0.8 to 1.0.

5. The showerhead of claim 4, wherein the third predetermined ratio is 1.0 to 1.2.

6. The showerhead of claim 3, wherein the second predetermined ratio is 1.1 to 1.4.

7. The showerhead of claim 6, wherein the third predetermined ratio is 1.1 to 1.4.

8. The showerhead of claim 1, wherein the primary type of through holes are located in a radially inner portion of the showerhead and the secondary type of through holes are located in a radially outer portion of the showerhead.

9. The showerhead of claim 8, wherein the tertiary type of through holes are located in the radially outer portion of the showerhead.

10. The showerhead of claim 1, wherein the through holes in each of the groups is nearer to the respective one of the plurality of injectors than to any other of the plurality of injectors, wherein each of the through holes in some of the separate groups have a same diameter and through holes in others of the separate groups have different diameters.

11. The showerhead of claim 1, wherein the through holes in each of the groups is nearer to the respective one of the plurality of injectors than to any other of the plurality of injectors.

12. The showerhead of claim 1, wherein the plurality of through holes comprises at least one central group of through holes and a first plurality of groups of the through holes arranged in a first hexagonal pattern around the at least one central group.

13. The showerhead of claim 12, further comprising a second plurality of groups of the through holes arranged in a second hexagonal pattern around the first plurality of groups.

14. The showerhead of claim 1, wherein the plurality of through holes includes at least one central group of the through holes and a first plurality of groups of the through holes arranged in a first circular pattern around the at least one central group.

15. The showerhead of claim 14, further comprising at least one second plurality of groups of the through holes arranged in a second circular pattern around the first plurality of groups.

16. The showerhead of claim 1, wherein the plurality of through holes includes a plurality of groups of the through holes, wherein the plurality of groups of through holes includes at least one central group, wherein remaining groups of the plurality of groups are arranged in successive radial regions around the at least one central group, and wherein each of the successive radial regions includes an increase of 6 groups relative to an inwardly adjacent one of the successive radial regions.

17. The showerhead of claim 1, wherein the plurality of through holes includes a plurality of groups of the through holes, wherein the plurality of groups of through holes includes at least one central group, wherein remaining groups of the plurality of groups are arranged in successive radial regions around the at least one central group, and wherein each of the successive radial regions includes an increase of 8 groups relative to an inwardly adjacent one of the successive radial regions.

18. The showerhead of claim 1, wherein the plurality of through holes includes 85 groups of the through holes.

\* \* \* \* \*